United States Patent
Kwon

[11] Patent Number: 5,899,740
[45] Date of Patent: May 4, 1999

[54] METHODS OF FABRICATING COPPER INTERCONNECTS FOR INTEGRATED CIRCUITS

[75] Inventor: Chul-soon Kwon, Seoul, Rep. of Korea

[73] Assignee: Samsung Electronics Co., Ltd., Suwon, Rep. of Korea

[21] Appl. No.: 08/923,279

[22] Filed: Sep. 4, 1997

[30] Foreign Application Priority Data

Mar. 4, 1997 [KR] Rep. of Korea .................. 97-7271

[51] Int. Cl.⁶ .................................. H01L 21/4763
[52] U.S. Cl. .................. 438/627; 438/643; 438/648; 438/653; 438/656; 438/659; 438/685; 438/687; 438/783; 438/785; 438/985
[58] Field of Search .................. 438/627, 643, 438/648, 653, 656, 659, 685, 687, 783, 785, 985

[56] References Cited

U.S. PATENT DOCUMENTS

| | | |
|---|---|---|
| 4,965,656 | 10/1990 | Kooubuchi et al. .................. 357/71 |
| 4,990,997 | 2/1991 | Nishida .................. 357/71 |
| 5,104,848 | 4/1992 | Miedema et al. .................. 505/1 |
| 5,391,517 | 2/1995 | Gelatos et al. .................. 437/190 |
| 5,668,411 | 9/1997 | Hong et al. .................. 257/751 |
| 5,753,945 | 5/1998 | Chivukula et al. .................. 257/295 |
| 5,804,249 | 9/1998 | Sukharev et al. .................. 427/99 |

*Primary Examiner*—John F. Niebling
*Assistant Examiner*—David A. Zarneke
*Attorney, Agent, or Firm*—Myers Bigel Sibley & Sajovec

[57] ABSTRACT

Interconnects for integrated circuit substrates are formed by forming a diffusion-barrier film on an integrated circuit substrate and amorphizing the diffusion-barrier film to create an amorphous diffusion-barrier film. A copper film is then formed on the amorphous diffusion-barrier film. Amorphizing may be performed by implanting ions into the diffusion-barrier film. The diffusion-barrier film can include Mo, W, Ti, Wn, TiW, TiN and the ions may be boron, nitrogen and silicon ions. Interconnect structures according to the invention include an amorphous conductive diffusion-barrier film on an integrated circuit substrate and a copper film on the amorphous conductive diffusion-barrier film. The amorphous conductive diffusion-barrier film preferably contains ions therein. The amorphous conductive diffusion-barrier film and the ions may be selected from materials as described above.

21 Claims, 3 Drawing Sheets

METHODS OF FABRICATING COPPER INTERCONNECTS FOR INTEGRATED CIRCUITS

FIELD OF THE INVENTION

This invention relates to integrated circuit fabricating methods and more particularly to methods of fabricating interconnects for integrated circuits, and integrated circuits so fabricated.

BACKGROUND OF THE INVENTION

Interconnects are generally used in integrated circuits to connect the active devices thereof. For example, in an integrated circuit such a microprocessor or a memory device containing thousands or millions of transistors, interconnects are used to connect the transistors to one another in predetermined interconnection patterns to form an operational device. As the integration density of integrated circuit devices continues to increase, multiple levels of interconnects are used to form all the requisite connections between active devices in the integrated circuit. The interconnects are generally formed of metal such as aluminum or copper.

As the integration density of integrated circuit devices continues to increase, the performance of the interconnects may have a larger impact on the performance of the integrated circuit. In particular, the interconnect structure and fabrication process may have a significant impact on the operational speed, product yields and reliability of the integrated circuit devices.

In integrated circuits with low integration density, metal interconnects are generally formed of pure aluminum. However, since aluminum can absorb silicon atoms from a silicon substrate during high temperature processing, junction spiking may occur. Accordingly, an alloy of aluminum and one percent silicon, referred to as Al-1% Si may be used instead of pure aluminum. The Al-1% Si may be obtained by oversaturating aluminum with silicon.

Unfortunately, when Al-1% Si is used for an interconnect, silicon may precipitate from the interconnect during heat treatments at about 450° C. and above, thus forming silicon residues. The silicon residues may epitaxially grow in a solid phase in a contact hole, thus forming a silicon nodule. These silicon nodules may undesirably increase the contact resistance of the metal interconnect.

In order to reduce or prevent aluminum spiking, silicon residues and/or silicon nodules which are caused by reactions between a metal interconnect and a silicon substrate, it is known to use a diffusion-barrier film between the metal interconnect layer and an underlying substrate or insulation layer. For example, titanium nitride (TiN) thin films may be used as a diffusion barrier.

Copper is now being increasingly investigated and used as an interconnect for high density integrated circuits, among other reasons because copper has a lower resistivity than aluminum. Unfortunately, since copper diffuses more rapidly in a diffusion-barrier film than aluminum, a conventional TiN diffusion-barrier film may lose its ability to function as a diffusion barrier at 600° C. or above. The diffusion barrier effectiveness may be lost because a TiN film may not efficiently block copper diffused along the grain boundaries which are formed in the columnar structure of a TiN film. In addition, because the TiN film is generally formed by sputtering, the TiN film may be uneven and may have poor step coverage.

SUMMARY OF THE INVENTION

It is therefore an object of the present invention to provide improved copper film interconnects and fabrication methods for integrated circuits.

It is another object of the present invention to provide improved diffusion barriers and fabrication methods for interconnects including copper films.

It is another object of the present invention to provide diffusion barriers and fabrication methods for copper films which can be effective at high temperatures.

These and other objects are provided, according to the present invention, by forming a diffusion-barrier film on an integrated circuit substrate and then amorphizing the diffusion-barrier film to create an amorphous diffusion barrier film. A copper film is then formed on the amorphous diffusion-barrier film to thereby form an interconnect for an integrated circuit.

The amorphizing step is preferably performed by implanting ions into the diffusion-barrier film to create an amorphous diffusion-barrier film. The diffusion-barrier film is preferably formed from at least one material selected from the group consisting of Mo, W, Ti, Wn, TiW, TiN and may be formed by chemical vapor deposition. The ions which are implanted are preferably selected from the group consisting of boron, nitrogen and silicon ions. A second diffusion-barrier film may also be formed on the copper film opposite the earlier formed amorphous diffusion-barrier film. The second film may also be amorphized as described above.

It has been found, according to the invention, that the amorphous diffusion-barrier film can prevent diffusion of copper from the copper film into the diffusion barrier. In particular, the amorphizing step reduces the crystalline structure of the diffusion-barrier film. Diffusion of copper along the grain boundaries of the diffusion-barrier film can thereby be reduced and preferably prevented, to thereby provide improved interconnects for integrated circuits.

First level interconnects for integrated circuits, according to the invention, may be fabricated by forming a dielectric layer on an integrated circuit substrate, the dielectric layer including a contact hole that exposes a portion of the integrated circuit substrate. A diffusion-barrier film is formed on the dielectric layer opposite the integrated circuit substrate and on the exposed of portion of the integrated circuit substrate. The diffusion-barrier film is then amorphized to create an amorphous diffusion-barrier film, and a copper film is formed on the amorphous diffusion-barrier film. A second diffusion-barrier film may be formed on the copper film opposite the first amorphous diffusion-barrier film. The second diffusion-barrier film is also amorphized to create a second amorphous diffusion-barrier film.

To form multi-level interconnections, a second dielectric layer is formed on the second amorphous diffusion-barrier film, opposite the copper film. The second dielectric layer includes a second contact hole that exposes a portion of the second amorphous diffusion-barrier film. A third diffusion-barrier film is formed on the second dielectric layer opposite the underlying conductor and on the exposed portion of the amorphous diffusion-barrier film. The third diffusion-barrier is amorphized to create a third amorphous diffusion-barrier film, and a second copper film is formed on the third amorphous diffusion-barrier film. A fourth diffusion-barrier film may then be formed on the second copper film opposite the third amorphous diffusion-barrier film, and it may be amorphized. Three, four or more levels of interconnects may be formed using amorphized diffusion-barrier films and copper films.

Interconnect structures for integrated circuits according to the invention include an amorphous conductive diffusion-barrier film on an integrated circuit substrate and a copper film on the amorphous diffusion-barrier film. The amorphous conductive diffusion-barrier film preferably contains ions therein. The amorphous diffusion-barrier film preferably comprises at least one material selected from the group consisting of Mo, Wi, Ti, Wn, TiW, TiN as before. The ions are preferably selected from the group consisting of boron, nitrogen and silicon ions. A second amorphous conductive diffusion-barrier film may also be included on the copper film, opposite the first amorphous conductive diffusion-barrier film. Improved interconnect fabrication methods and interconnection structures are thereby provided.

DETAILED DESCRIPTION OF PREFERRED EMBODIMENTS

Figure 1:
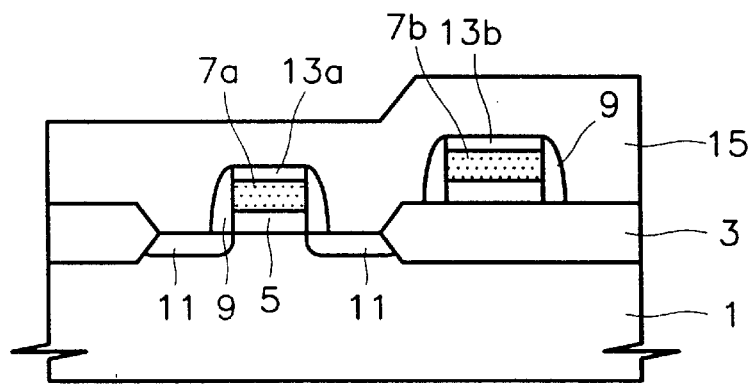
FIGS. 1–8 are cross-sectional views illustrating methods of fabricating interconnects for integrated circuits according to the present invention and interconnects so fabricated.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers, films and regions are exaggerated for clarity. Like numbers refer to like elements throughout. It will also be understood that when a layer, film or region is referred to as being "on" another layer, film or substrate, it can be directly on the other layer, film or substrate, or intervening layers may also be present.

Referring now to FIGS. 1–8, methods of fabricating interconnects for integrated circuits according to the present invention will now be described. Referring to FIG. 1, a transistor, including a gate insulating film 5, a gate electrode 7a, a spacer 9, a source/drain region 11, and a capping insulation layer 13a, is formed in an active region of an integrated circuit substrate such as a semiconductor substrate 1, that is defined by a field oxide film 3. A gate electrode 7b and a capping insulation layer 13b are also included on the field oxide film 3. Then, a first interlevel dielectric layer 15 is formed on the substrate surface including on the transistor and gate. The design and fabrication of transistors and interlevel dielectric layers are well known to those having skill in the art and need not be described further.

Figure 2:
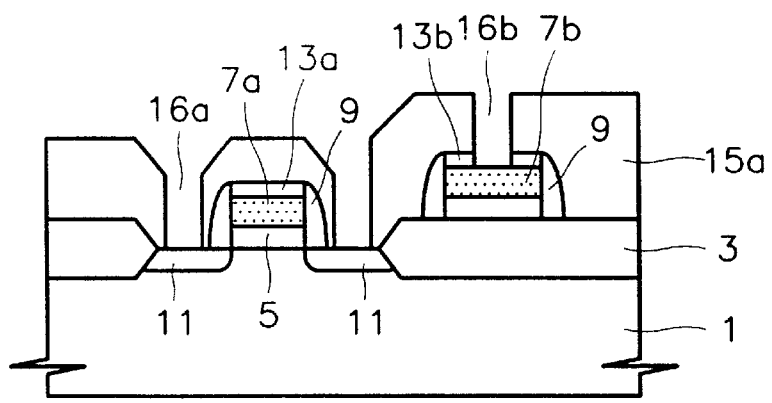

As shown in FIG. 2, a first interlevel dielectric layer pattern 15a is formed including a contact hole 16a for exposing the surface of the source/drain region 11 of the semiconductor substrate 1, for example by etching the first interlevel dielectric layer 15 using conventional photolithography and etching. The capping insulation layer 13b formed on the field oxide film 3 is also etched, thereby forming a contact hole 16b for exposing the gate electrode 26.

Figure 3:
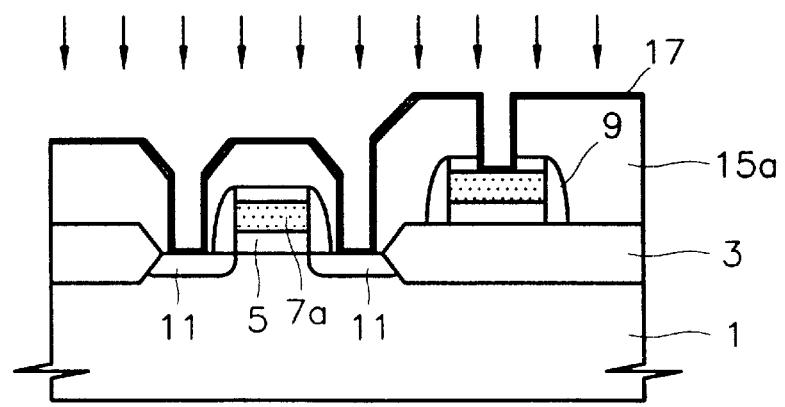

Referring now to FIG. 3, a first diffusion-barrier film is formed of, for example at least one of Mo, W, Ti, Ta, TiW, TiN. The first diffusion-barrier film is formed on the dielectric layer pattern 15a and on the surface of the semiconductor substrate 1 exposed by the contact holes 16a and 16b. The first diffusion-barrier film may have a thickness of 100–1,000Å. The diffusion-barrier film may be formed at temperatures between 300° and 600° C. by chemical vapor deposition (CVD), such as low pressure (LPCVD) or plasma enhanced CVD (PECVD) which can produce few defects and excellent step coverage.

Still referring to FIG. 3, a first amorphous diffusion-barrier film 17 is formed by amorphizing the first diffusion-barrier film. The first diffusion-barrier film may be amorphized by implanting ions, for example, boron (B), nitrogen (N), and/or silicon (Si) ions into the first diffusion-barrier film at an accelerating voltage of 20–140 KeV at a does of $10^{16}10^{17}$ ions/cm$^2$. The implanted impurity ions may settle at the interface between the semiconductor substrate 1 and the first amorphous diffusion-barrier film 17.

The first amorphous diffusion-barrier film 17 can reduce and preferably prevent copper from diffusing into the source/drain region 11 and the gate electrode 7 along the grain boundary below 800° C., because the crystalline structure of the first amorphous diffusion-barrier film 17 becomes amorphous by the ion implantation. In addition, it can reduce and preferably prevent reaction between the first interlevel dielectric layer pattern 15a and a later formed first copper film.

Figure 4:
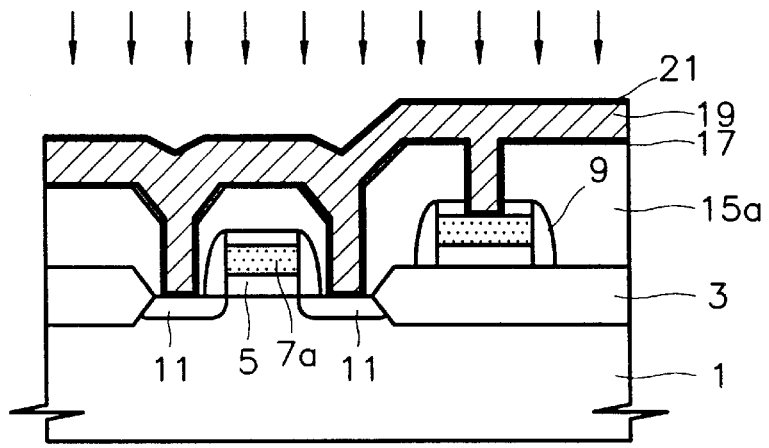

As shown in FIG. 4, a first copper film 19 is formed on the substrate 1 having the first amorphous diffusion-barrier film 17 formed thereon, for example, using metal organic CVD (MOCVD). A second amorphous diffusion-barrier film 21 is formed on the first copper film 19 in the same manner as described above for forming the first amorphous diffusion-barrier film 17. The second amorphous diffusion-barrier film 21 prevents reaction between the first copper film 19 and a later formed second interlevel dielectric layer pattern.

Figure 5:
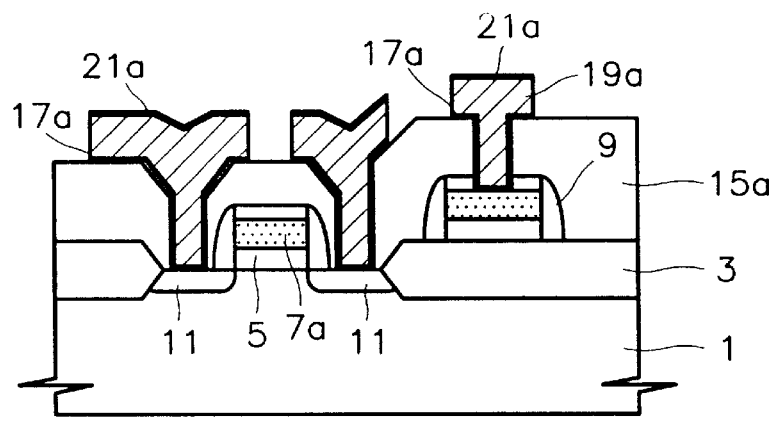

In FIG. 5, a second amorphous diffusion-barrier film pattern 21a, a first copper film pattern 19a, and a first diffusion-barrier film pattern 17a are formed by etching the second amorphous diffusion-barrier film 21, the first copper film 19, and the first amorphous diffusion-barrier film 17.

Figure 6:
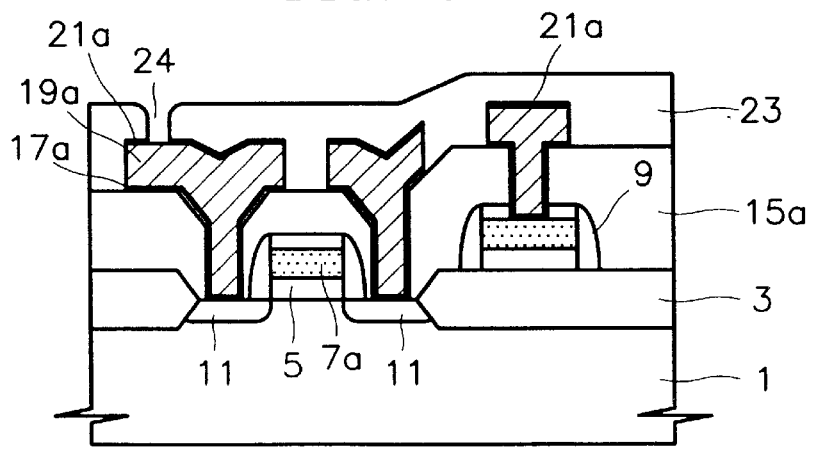

Then, as shown in FIG. 6, a second interlevel dielectric layer is formed on the substrate 1. A second interlevel dielectric layer pattern 23 is then formed including a contact hole or via hole 24 that exposes the first copper film pattern 21a, for example by etching the second interlevel dielectric layer and the second amorphous diffusion-barrier film pattern 21a.

Figure 7:
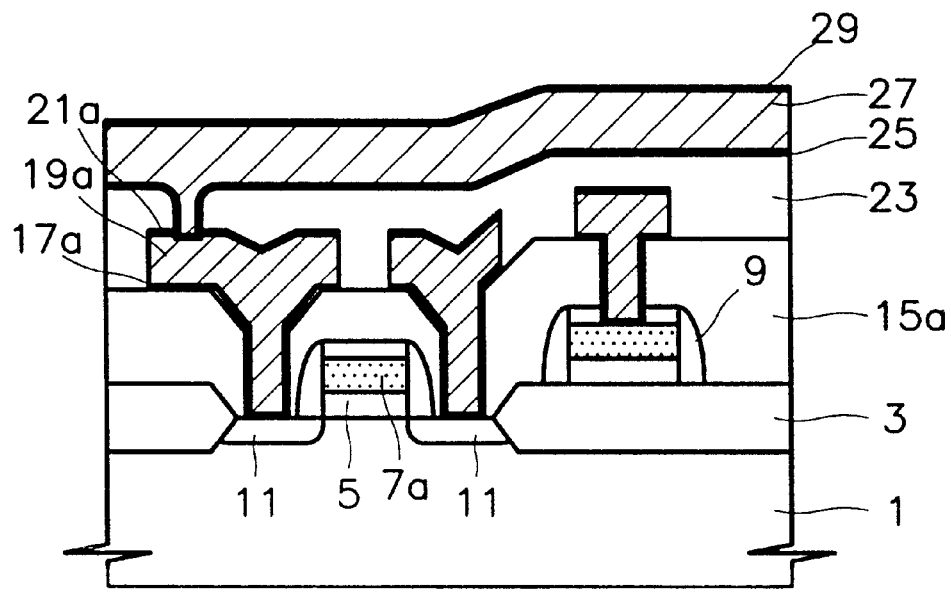

In FIG. 7, a third amorphous diffusion-barrier film 25 is formed on the substrate to bury the via hole 24, in the same manner as was described for forming the first amorphous diffusion-barrier film 17. The third amorphous diffusion-barrier film 25 reduces and preferably prevents reaction between the first copper film pattern 21a and a later formed second copper film 27. The second copper film 27 is formed on the third amorphous diffusion-barrier film 25 in the same manner as was described for forming the first copper film 19.

Still referring to FIG. 7, a fourth amorphous diffusion-barrier film 29 is formed on the second copper film 27 in the same manner as was described for forming the first amorphous diffusion-barrier film 17. The fourth amorphous diffusion-barrier film 29 reduces and preferably prevents reaction between the second copper film 27 and a later formed passivation film.

Figure 8:
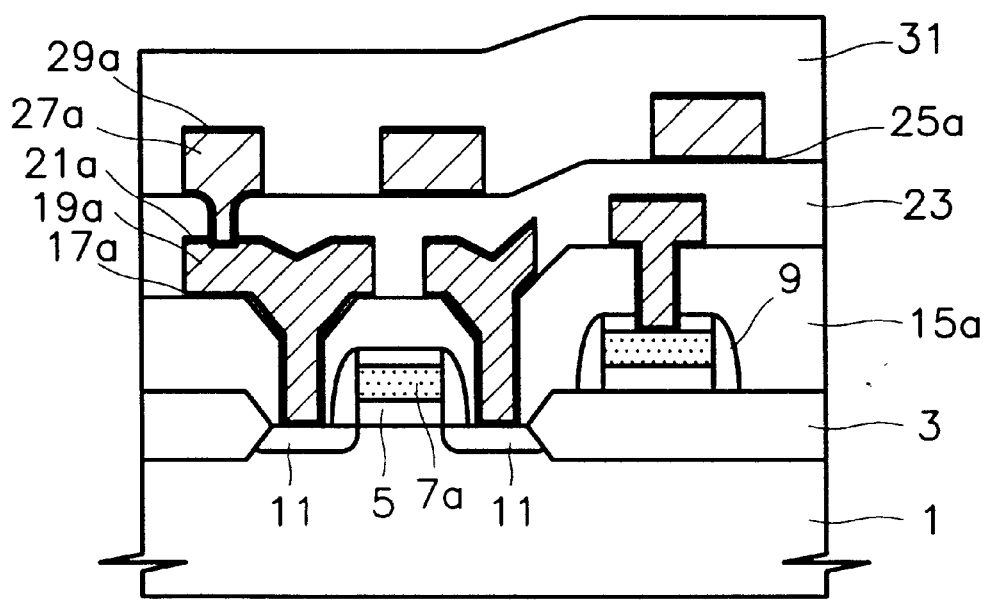

Finally, in FIG. 8, a fourth amorphous diffusion-barrier film pattern 29a, a second copper film pattern 27a, and a third amorphous diffusion-barrier film 25a are formed by etching the fourth amorphous diffusion-barrier film 29, the second copper film 27, and the third amorphous diffusion-barrier film 25. Then, an integrated circuit device may be completed by forming a passivation film 31 on the substrate.

EXAMPLE

The diffusion-barrier characteristics of amorphous diffusion-barrier films of the present invention and conventional diffusion-barrier films will now be compared. The following example is illustrative and should not be construed as limiting.

A diffusion-barrier film and a copper film were formed on a silicon substrate according to the present invention, and heated at 300°~600° C. for 30~120 minutes. The copper film was then removed. A diffusion-barrier film and a copper film were also formed on the surface of a silicon substrate using conventional technology, and heated at 300°~600° C. for 30~120 minutes. The copper film was then removed.

It was determined that copper penetrated the conventional diffusion-barrier film and thus generated defects on the silicon substrate in the conventional sample. In contrast, copper did not penetrate the amorphous diffusion-barrier film according to the invention, and thus there were no defects in the sample of the present invention.

As described above, integrated circuit fabricating methods of the present invention can reduce and preferably prevent diffusion of copper along grain boundaries of diffusion-barrier films. Diffusion-barrier films may be formed by CVD, to provide low defect generation and excellent step coverage. The diffusion-barrier films are amorphized by implanting impurity ions such as nitrogen, silicon, or boron ions into the diffusion-barrier films. Thus, the crystalline structures of the diffusion-barrier films are made amorphous.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating an interconnect for an integrated circuit comprising the steps of:
    forming a diffusion barrier film on an integrated circuit substrate;
    amorphizing the diffusion barrier film to create an amorphous diffusion barrier film by implanting ions selected from the group consisting of boron, nitrogen and silicon into the diffusion barrier film; and
    forming a copper film on the amorphous diffusion barrier film.

2. A method according to claim 1 wherein the step of forming a diffusion barrier film comprises the step of forming a diffusion barrier film from at least one material selected from the group consisting of Mo, W, Ti, WN, TiW and TiN.

3. A method according to claim 1 wherein the step of forming a diffusion barrier film comprises the step of chemical vapor depositing a diffusion barrier film on an integrated circuit substrate.

4. A method according to claim 1 wherein the step of forming a copper film is followed by the steps of:
    forming a second diffusion barrier film on the copper film, opposite the amorphous diffusion barrier film; and
    amorphizing the second diffusion barrier film to create a second amorphous diffusion barrier film.

5. A method according to claim 4 wherein the step of amorphizing the second diffusion barrier film step comprises the step of implanting ions into the second diffusion barrier film to create a second amorphous diffusion barrier film.

6. A method according to claim 1 wherein the step of forming a diffusion barrier film comprises the step of forming a diffusion barrier film on an interlevel dielectric layer on an integrated circuit substrate.

7. A method of fabricating an interconnect for an integrated circuit comprising the steps of:

forming a dielectric layer on an integrated circuit substrate, the dielectric layer including a contact hole that exposes a portion of the integrated circuit substrate;
    forming a diffusion barrier film on the dielectric layer opposite the integrated circuit substrate and on the exposed portion of the integrated circuit substrate;
    amorphizing the diffusion barrier film to create an amorphous diffusion barrier film by implanting ions selected from the group consisting of boron, nitrogen and silicon into the diffusion barrier film; and
    forming a copper film on the amorphous diffusion barrier film.

8. A method according to claim 7 wherein the step of forming a diffusion barrier film comprises the step of forming a diffusion barrier film from at least one material selected from the group consisting of Mo, W, Ti, WN, TiW and TiN.

9. A method according to claim 7 wherein the step of forming a diffusion barrier film comprises the step of chemical vapor depositing a diffusion barrier film on the dielectric layer opposite the integrated circuit substrate and on the exposed portion of the integrated circuit substrate.

10. A method according to claim 7 wherein the step of forming a copper film is followed by the steps of:
    forming a second diffusion barrier film on the copper film, opposite the amorphous diffusion barrier film; and
    amorphizing the second diffusion barrier film to create a second amorphous diffusion barrier film.

11. A method according to claim 10 wherein the step of amorphizing the second diffusion barrier film step comprises the step of implanting ions into the second diffusion barrier film to create a second amorphous diffusion barrier film.

12. A method according to claim 10 further comprising the steps of: forming a second dielectric layer on the second amorphous diffusion barrier film, opposite the copper film, the second dielectric layer including a second contact hole that exposes a portion of the second amorphous diffusion barrier film;
    forming a third diffusion barrier film on the second dielectric layer opposite the underlying conductor and on the exposed portion of the second amorphous diffusion barrier film;
    amorphizing the third diffusion barrier film to create a third amorphous diffusion barrier film; and
    forming a second copper film on the third amorphous diffusion barrier film.

13. A method according to claim 12 wherein the amorphizing step comprises the step of implanting ions into the third diffusion barrier film to create a third amorphous diffusion barrier film.

14. A method according to claim 12 wherein the step of forming a second copper film is followed by the steps of:
    forming a fourth diffusion barrier film on the second copper film, opposite the third amorphous diffusion barrier film; and
    amorphizing the fourth diffusion barrier film to create a fourth amorphous diffusion barrier film.

15. A method according to claim 14 wherein the step of amorphizing the fourth diffusion barrier film step comprises the step of implanting ions into the fourth diffusion barrier film to create a fourth amorphous diffusion barrier film.

16. A method of fabricating an interconnect for an integrated circuit comprising the steps of:
    forming a dielectric layer on an integrated circuit substrate, the dielectric layer including a contact hole that exposes an underlying conductor;

forming a diffusion barrier film on the dielectric layer opposite the underlying conductor and on the exposed portion of the underlying conductor;

amorphizing the diffusion barrier film to create an amorphous diffusion barrier film by implanting ions selected from the group consisting of boron, nitrogen and silicon into the diffusion barrier film; and forming a copper film on the amorphous diffusion barrier film.

17. A method according to claim 16 wherein the step of forming a diffusion barrier film comprises the step of forming a diffusion barrier film from at least one material selected from the group consisting of Mo, W, Ti, WN, TiW and TiN.

18. A method according to claim 16 wherein the step of forming a diffusion barrier film comprises the step of chemical vapor depositing a diffusion barrier film on the dielectric layer opposite the underlying conductor and on the exposed portion of the underlying conductor.

19. A method according to claim 16 wherein the step of forming a copper film is followed by the steps of:

forming a second diffusion barrier film on the copper film, opposite the amorphous diffusion barrier film; and amorphizing the second diffusion barrier film to create a second amorphous diffusion barrier film.

20. A method according to claim 19 wherein the step of amorphizing the second diffusion barrier film step comprises the step of implanting ions into the second diffusion barrier film to create a second amorphous diffusion barrier film.

21. A method according to claim 16 wherein the underlying conductor is an underlying copper conductor.

* * * * *